(12) United States Patent
Niu et al.

(10) Patent No.: US 9,828,673 B2
(45) Date of Patent: Nov. 28, 2017

(54) METHOD OF FORMING VERY REACTIVE METAL LAYERS BY A HIGH VACUUM PLASMA ENHANCED ATOMIC LAYER DEPOSITION SYSTEM

(71) Applicants: Feng Niu, Arlington Heights, IL (US); Peter Chow, Eden Prairie, MN (US)

(72) Inventors: Feng Niu, Arlington Heights, IL (US); Peter Chow, Eden Prairie, MN (US)

(73) Assignee: SVT Associates, Inc., Eden Prairie, MN (US)

( * ) Notice: Subject to any disclaimer, the term of this patent is extended or adjusted under 35 U.S.C. 154(b) by 0 days.

(21) Appl. No.: 14/492,269

(22) Filed: Sep. 22, 2014

(65) Prior Publication Data

US 2016/0083842 A1     Mar. 24, 2016

(51) Int. Cl.
*C23C 16/18* (2006.01)
*C23C 16/44* (2006.01)
*C23C 16/455* (2006.01)

(52) U.S. Cl.
CPC ........ *C23C 16/45536* (2013.01); *C23C 16/18* (2013.01); *C23C 16/4402* (2013.01)

(58) Field of Classification Search
None
See application file for complete search history.

(56) References Cited

U.S. PATENT DOCUMENTS

| | | | | |
|---|---|---|---|---|
| 5,399,881 A | * | 3/1995 | Bozovic | H01L 39/225 257/31 |
| 2007/0119370 A1 | * | 5/2007 | Ma | C23C 16/18 118/723 E |
| 2008/0124924 A1 | * | 5/2008 | Naik | C23C 18/08 438/675 |
| 2008/0311688 A1 | * | 12/2008 | Yamashita | G06F 17/5036 438/14 |
| 2008/0311739 A1 | * | 12/2008 | Besling | H01L 21/76834 438/643 |
| 2009/0045514 A1 | * | 2/2009 | Ishizaka | C23C 16/36 257/751 |
| 2012/0100308 A1 | * | 4/2012 | Milligan | C23C 16/36 427/569 |
| 2012/0207928 A1 | * | 8/2012 | Dussarrat | H01L 21/02181 427/255.28 |
| 2014/0291448 A1 | * | 10/2014 | Luck | B64B 1/14 244/123.14 |

* cited by examiner

*Primary Examiner* — Jay C Chang

(57) ABSTRACT

This invention provides a method and a system to deposit a thin layer of very reactive metals by plasma enhanced atomic layer deposition (PEALD). The very reactive metals, selected from the highly electropositive elements include alkaline earth metals, group III metals, and some transition and rare earth metals. The method is comprised of sequentially pulsing one of above mentioned metal containing organometallic precursors and a hydrogen plasma as a reducing agent into a high vacuum reaction chamber containing a substrate surface with pulsed or continuous flow of an inert purge gas between each pulsing step. The system comprising a very high efficiency H plasma source, the high vacuum reactor chamber, an anti-corrosion turbo pump and a high vacuum load lock is required for reducing contaminant gases such as $O_2$, $H_2O$, and $CO_2$, and for increasing hydrogen plasma efficiency.

2 Claims, 9 Drawing Sheets

*(Side view)*

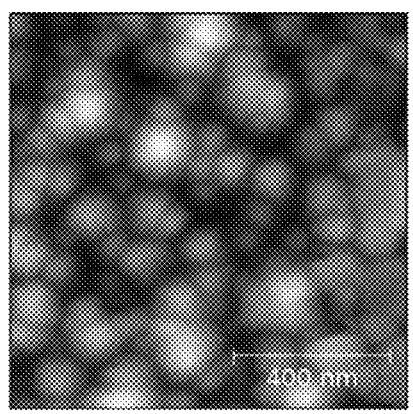 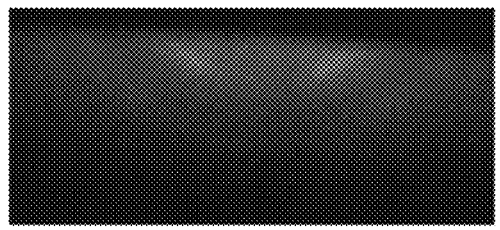 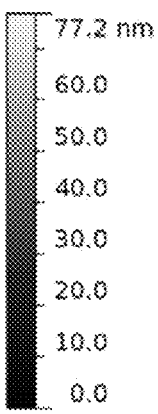
FIG. 7A.                    FIG. 7B

METHOD OF FORMING VERY REACTIVE METAL LAYERS BY A HIGH VACUUM PLASMA ENHANCED ATOMIC LAYER DEPOSITION SYSTEM

REFERENCES CITED

U.S. Patent Documents

| 8,133,555 | B2 | March 2012 | Shinriki, et. al. |
|---|---|---|---|
| 0,093,848 | A1 | May 2006 | Senkovich et al. |
| 0,102,205 | A1 | May 2008 | Barry et al. |

OTHER PUBLICATIONS

T. Suntola, Thin Solid Films, 216(1992) 84-89.

Y. J. Lee & S. W. Kang, Electrochemical and Solid-State Letters, 5~10, C91-C93 (2002).

Y. J. Lee & S. W. Kang, J. Vac. Sci. Technol. A 20, 6, 1983(2002).

J. S. Corneille, J. W. He, D. W. Goodman, Surface Science 306(1994) 269-278.

S. Rajput, S. Chaudhary, S. C Kashyap and P. Srivastava, Bull. Mater. Sci., Vol. 29, No. 3, June 2006, pp. 207-211, Indian Academy of Sciences.

http:/srdata.nist.gov/xps/.

Z. W. Li, A. Rahtu, and R. Gordon, J. Electrochemical Society, 153(11) C787-C794 (2006).

B. Han, etal., Angew. Chem. Int. Ed., 2010, 49, 148-152.

This application claims the benefits of provisional patent application No 61/898,369, filed on Oct. 31, 2013 by the present inventors

BACKGROUND OF THE INVENTION

1. Field of the Invention

The present invention relates generally to a method of forming very reactive, elemental metal layers by Atomic layer deposition (ALD), more specifically a hydrogen reduction method by plasma enhanced ALD (PEALD), and a high vacuum ALD system configured for realization of this method.

2. Description of the Related Art

ALD is a cyclic process carried out by dividing a conventional chemical vapor deposition (CVD) process into an iterated sequence of self-saturating deposition cycles. See e.g., T. Suntola, Thin Solid Films, 216(1992) 84-89. Unlike CVD where the reacting gases are mixed in the process chamber and continuously react to form a film, ALD reacting gases are delivered separately to react with the surface instead of with each other. Each reaction is self-terminating, depositing a single layer at a time, independent of gas flow distribution or gas transport into substrate features and forming super conformal, continuous coatings in relatively low process temperatures. ALD has been able to provide a critical need for an important technology at a time when no other methods could meet the need. For example, non-planar devices impose geometrical challenges for materials integration, The required conformal deposition necessitates layer-by-layer fabrication that is only delivered by ALD. PEALD is an energy-enhanced ALD method, the surface is exposed to the species generated by plasma during the reactant step. Typical plasmas used during PEALD are those generated in $O_2$, $N_2$, $NH_3$ and $H_2$ reactant gases or combinations thereof. Such plasmas can replace ligand-exchange reactions typical of $H_2O$, and they can be employed to deposit metal oxides, metal nitrides and metal films. PEALD offers several merits for the deposition of ultra-thin films over thermal ALD and other vapor phase deposition techniques such as the high reactivity of the plasma species on the deposition surface, allowing lower deposition temperatures and more freedom for processing on a wider range of temperature—sensitive materials.

A diversity of materials have been deposited successful by ALD technique such as oxides, nitrides, fluorides, sulfides, noble metals and some transition metals with established applications in high κ oxides and transistors, DRAM, magnetic-write heads, and some emerging applications such as gas permeation environmental barriers, and passivation layers for Si solar cells.

One of key challenges currently limiting progress in ALD and critical developments that are needed to advance the ALD state-of-the art is depositing very reactive elemental metal layer. The very reactive metals are defined as highly electropositive elements (Electronegativity $\chi<1.8$) including alkaline metals (Li, Na, K, etc), alkaline earth metals (Be, Mg, Ca, etc), some transition and rare earth metals. Very reactive metal layers are needed for applications such as improved adhesion, barrier, and device performance, etc. . . . However it has been proved very difficult to deposit by either conventional thermal ALD or PEALD in a conventional roughing pump backed reactor where a base pressure is at level of 1 mTorr.

For one reason, these very reactive elemental metals thermodynamically favor in forming much more stable compounds such as fluorides, oxides, nitrides, and carbides, thus it is very hard to avoid contamination by impurity gases such as oxygen, $H_2O$, nitrogen, carbon oxides, etc. in a conventional ALD reactor, or preserve metallic surface after deposition without passivation. These compounds basically act as thermodynamic sinks to prevent formation of pure metals. Aluminum for example is a very reactive metal. Its many=compounds like $Al_2O_3$, AlN, and AlC have much lower formation energy than that of the pure aluminum. Mg is another highly electropositive metal. Its compounds like $MgF_2$, $MgO/Mg(OH)_2$, MgC are thermodynamically much more stable than Mg too. In the both cases, impurity levels in the ALD reactor such as chlorine, $O_2$, $N_2$, $CO_2$, and $H_2O$ have to be sufficiently low. On the contrary, compounds of many less electropositive metals are less stable thus it is easier to from pure noble metals such as Pd, Ir, Pt, Cu, Ag, and some transition metals such as W, Fe, Co, and Ni by an ALD process.

Another reason is due to lack of precursors and co-reactants for a ALD process, commercially available precursors tend to use similar less electropositive metal precursors which are good for oxides and some for nitrides but create problem with very reactive metals.

The third reason is lack of reducing agents to break up chemical bonds of organometallic precursors for very reactive metals and surrounding ligands. Probably the most suitable reducing agent for any deposition process would be atomic hydrogen. Its advantages are high reducing power, reactivity and chemical compatibility with most processes. The main limitation for using atomic hydrogen is that it needs to be produced in-situ by dissociating molecular hydrogen into atomic ones with a plasma source or a hot tungsten filament. The mean free path for atomic hydrogen is the shortest.

U.S. Pat. No. 8,133,555 described a method for forming metal films by ALD using β-diketone metal complexes and a mixture gases of hydrogen and nitrogen activated by plasma. The applied metal elements cover some transition metals Ti, Mn, Fe, Co, Ni, Cu, Nb, Ta, Hf, Mo, W, and noble metals Rh, Pd, Ir, Pt, Ru, Ag, Au, and alkaline earth Mg, Sr, Ba. US patent application No. 2006/0093848 provide a ALD process of forming noble metals (Ru, Rb, Rd, Ir, Pt) using reducing gases from hydrogen, glyoxylic acid, oxalic acid, formaldehyde, 2-propanol, imidazole and plasma—activated hydrogen. US patent application No. 2008/0102205 invents an ALD process of forming metallic films including elemental metals using metal containing cyclopentadienyl precursors and hydrogen or hydrogen plasma. The metal containing cyclopentadienyl precursors comprises a metal selected from the group consisting of Al, Ga, In, Sc, Ti, V, Cr, Mn, Fe, CO, Ni, Y, Zr, Nb, Mo, Tc, Ru, Rh, La, Hf, Ta, W, Re, Os, and Ir, more preferably from the group consisting of Ti, Zr, Hf, Ta, W, Nb, and Mo. For some materials, direct reduction is difficult, indirect reduction method has to be used such as Fe, Co, and Ni. Ni $(Cp)_2$ cannot be reduced to Ni by atomic H directly, thus first be oxidized to NiO then be reduced to Ni element by atomic hydrogen.

SUMMARY OF THE INVENTION

Most of these metal elementals mentioned in prior art are less electropositive or relatively stable, thin films of very reactive element metals, especially like Mg and other alkaline earth metals have not been successfully deposited by an ALD method due to thermodynamic limitation, impurity requirements and unavailability of proper precursors and reducing agents. This current invention compared to previous art or conventional ALD reactors has following advantages:

A PEALD method using atomic H as a reducing agent is applied to deposit highly reactive metals. The method has been proved to he able to deposit Mg and Al using commercially available Al and Mg organometallic precursors such as Trimethyaluminium (TMAl)-Al $(CH3)_3$ and Bis (ethylcyclopentadienyl) magnesium $(Mg(CpEt)_2)$. A binary sequence surface chemistry is proposed that the hydrogen radicals serve to strip the ligands from the metal precursor according to the general overall reaction scheme: $MXn+ nH \rightarrow M+nHX$. All other types of organometallic precursors preferably not to contain fluorine and oxygen may be applied.

To obtain a pure very reactive metal layer by PEALD, a high vacuum PEALD system comprising a very high efficiency plasma source, a high vacuum and even ultrahigh vacuum reactor equipped with a high vacuum pump, and a high vacuum load lock is required For one reason, the rapid reduction of hydrogen recombination to form $H_2$ is a significant hydrogen radical loss mechanism when hydrogen radicals transmitting through an ALD reactor towards the substrate. Thus a high vacuum reactor with a base pressure less than $10^{-7}$ to $10^{-8}$ Torr level is necessary which may significantly increase mean free path of atomic H and thus improve H plasma efficiency. For another reason, if the vacuum pressure is high such as in a conventional roughing pump backed ALD reactor with a base pressure of 1 mTorr, atomic H may simultaneously activate impurity gases such as $N_2$, $O_2$, $CO_2$ in a plasma mode since all these gases have relatively low threshold energies for formation of glow discharges in an ALD reactor. This explains why a conventional PEALD method is more suitable for forming oxides by using oxygen gas. For deposition of some nitrides such as $Si_3N_4$, even though pure nitrogen plasma has been used, high quality nitrides are mostly associated with usage of $NH_3$ or even $N_2/H_2$ mixed plasma with high $H_2$ atomic ratio. A H plasma works in much lower pressure range of 1-10 mTorr, thus atomic H disassociation factor, efficiency and mean free path will be increased significantly To achieve very high H plasma efficiency, the distance between the plasma source and substrate has to be minimized. We also notice that an H plasma works more efficiently with assistance of Ar flow in the high vacuum ALD system. In addition, the system should be capable of handling corrosive organometallic precursors, and be robust when subject to pumping and mechanical stress induced fatigue during numerous cycles. All vacuum gauges and in situ monitoring tools are expected anti-corrosive too. The high vacuum system may be easily switched from the high vacuum reactor for growing $O_2$, $H_2O$, $CO_2$ sensitive materials like very reactive metals, some nitrides, carbides and borides to a conventional roughing pump backed reactor for growing oxides.

This disclosed method and system should also apply for deposition of many other very reactive metals such as Ca, Sr, Ba, Ti, Nb, Zr, Hf, etc., and even for subsequent reposition of non-oxide materials such as borides, carbides and nitrides where the materials are extremely sensitive to contaminants such as oxygen, moisture, carbon oxides, etc. . . .

BRIEF DESCRIPTION OF THE DRAWINGS

FIG. 6A is a composition depth profiling by XPS. FIG. 6B is a general survey scan after the Mg film surface is thoroughly cleaned by sputtering. FIG. 6C shows fine scans of binding energy (Eb) around the Mg2p peak at different depth compared to the Mg film surface.

FIGS. 7A to 7B

FIG. 7A is a photo showing AFM surface morphology of a ~70 nm thick Mg film with RMS roughness =13 nm; FIG. 7b shows a RHEED image from an as deposited Mg film surface indicating Mg film is mainly polycrystalline with some texture.

BRIEF DESCRIPTION OF THE SYMBOLS

Figure 1:
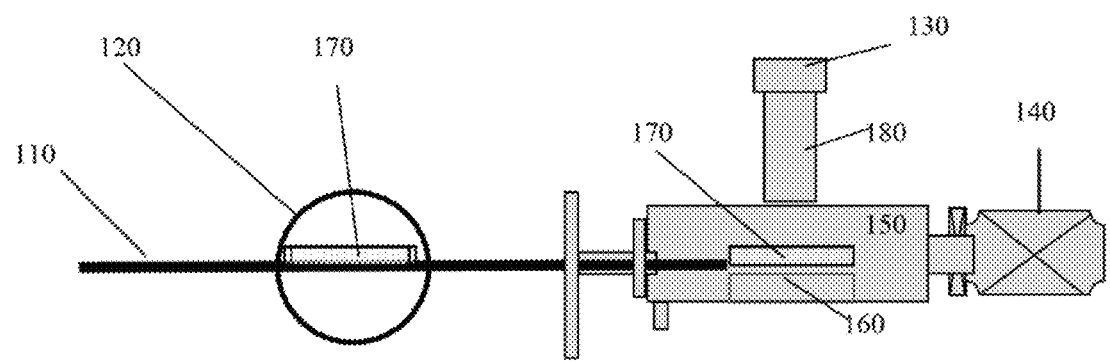
FIG. 1 shows a perspective right-side view of the plasma enhanced high vacuum ALD system for very reactive metal deposition.

110: Substrate transfer rod
120: High vacuum load lock
130: Matching box
140: Turbo pump
150: ALD reaction chamber
160: Substrate holder
170: Substrate
180: Remote plasma source
210: Precursor pulse
220: Inert gas purge
230: Hydrogen plasma pulse
240: The 2nd Inert gas purge
250: Repeat

DETAILED DESCRIPTION OF THE INVENTION

FIG. 1 shows the main parts of a cross-flow high vacuum PEALD system that is used for very reactive metal depositions. The reactor (150) is evacuated by a turbo pump (140) with a backing rotary vane pump. The system is also equipped with a sample transfer rod (110), a vacuum load lock (120), and a sample holding/unloading mechanism to avoid frequent venting of the reactor and reduce the reactor exposure to ambient atmosphere. A remote plasma source (180) is located on top central part of the reactor. The base vacuum pressure of at least $4 \times 10^{-7}$ Torr with $O_2 < 10^{-8}$ Torr, $H_2O$ and $CO_2 < 10^{-9}$ Torr as measured by a residual gas analyzer (RGA) can be achieved. Ultra-high purity Ar with $O_2$ and $H_2O$ in 10 ppb levels (with a built in filter) is used as the carrier gas. High purity $H_2$ (6N or higher) is used for generating hydrogen plasma. Bis(ethylcyclopentadienyl) magnesium (Mg $(CpEt)_2$) is used as the Mg precursor. The high vacuum ALD system has sufficiently high vacuum and low impurity gas levels, which is capable of preventing some very reactive metals from oxidation or carbonization. A con-flange sealed turbo pump is added thus the ALD is always in high vacuum conditions where impurity levels such as $O_2$, $H_2O$, N, C are significantly reduced; a load lock (LL) with auto or manual sample transfer mechanism is added, which avoids frequent exposure of the ALD reactor to ambient and thus further reduces introduction of impurity levels of above gases. This is crucial for depositions of the very reactive elemental metals.

In addition to high or ultrahigh vacuum requirement, the system has been proved capable of handling corrosive organometallic precursors, and working simultaneously in both molecular flow (low pressure) and viscous flow (high pressure) ranges. The system is also robust when subject to pumping and mechanical stress induced fatigue during numerous cycles. All vacuum gauges, valves and in situ monitoring tools are expected anti-corrosive too. All these requirements put a big challenge to the turbo/ backing pump system and the exhaust.

Figure 2:
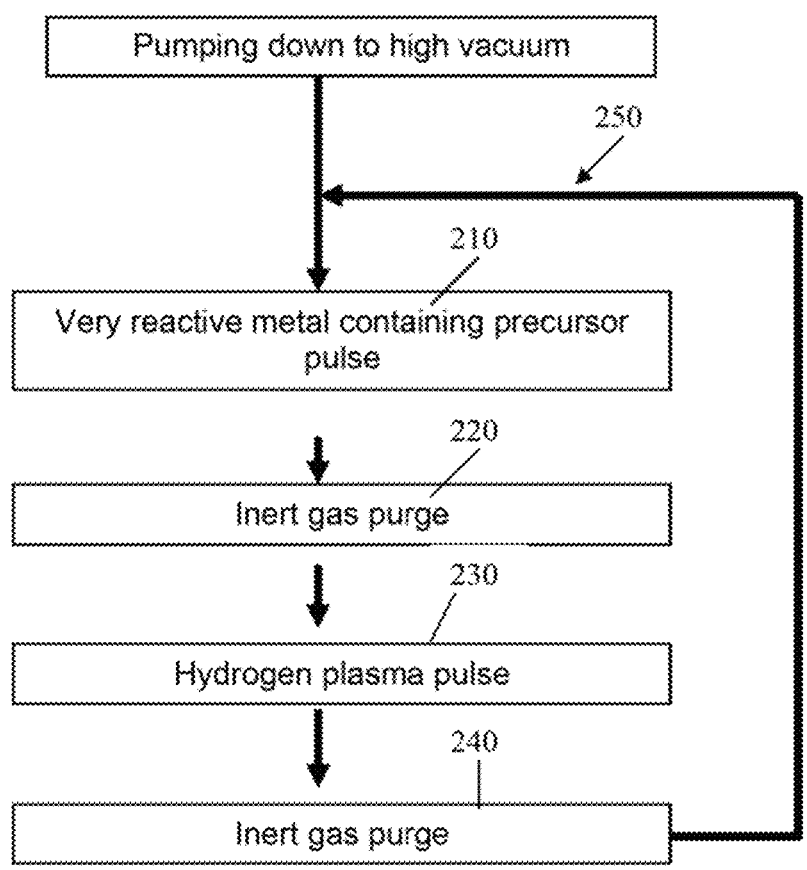
FIG. 2 is a process flow chart.

An ALD process cycle as shown in FIG. 2 comprises pulsing Mg precursor vapor such as Mg $(CpEt)_2$ into the reactor (210), purging the reactor with Ar carrier gas after the Mg precursor (220), pulsing a mixture of hydrogen and Ar into the reactor followed by switching on RF plasma RF power fix a desired time (230), and purging the reactor by Ar carrier gas after the hydrogen and Ar pulsing and plasma off (240). The ALD process cycle can be repeated (250) until the metal layer reaches a desired thickness. We prove that deposition of very reactive metals requires extremely low $H_2O/O_2/CO_2$ background pressure in ALD ($10^{-8}$ Torr or lower), nothing or oxides will be deposited if vacuum or background impurities are higher. The suggested ALD surface chemistry is:

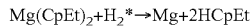

EXAMPLE 1

First of all, we reconfirm Al metal deposition process which has been reported over ten year ago but has not been reproduced by other groups until recently. See, e.g., Y. J. Lee, et al. Electrochemical and Solid-State Letters, 5~10, C91-C93 (2002); Y. J. Lee et al., J. Vac. Sci. Technol. A 20, 6, 1983 (2002). By using this process as a test bed we are able to evaluate vacuum quality of the high vacuum PEALD system and H plasma efficiency of the remote plasma source. Since Al is very reactive metal similar to Mg, both metals are easily oxidized.

Figure 3:
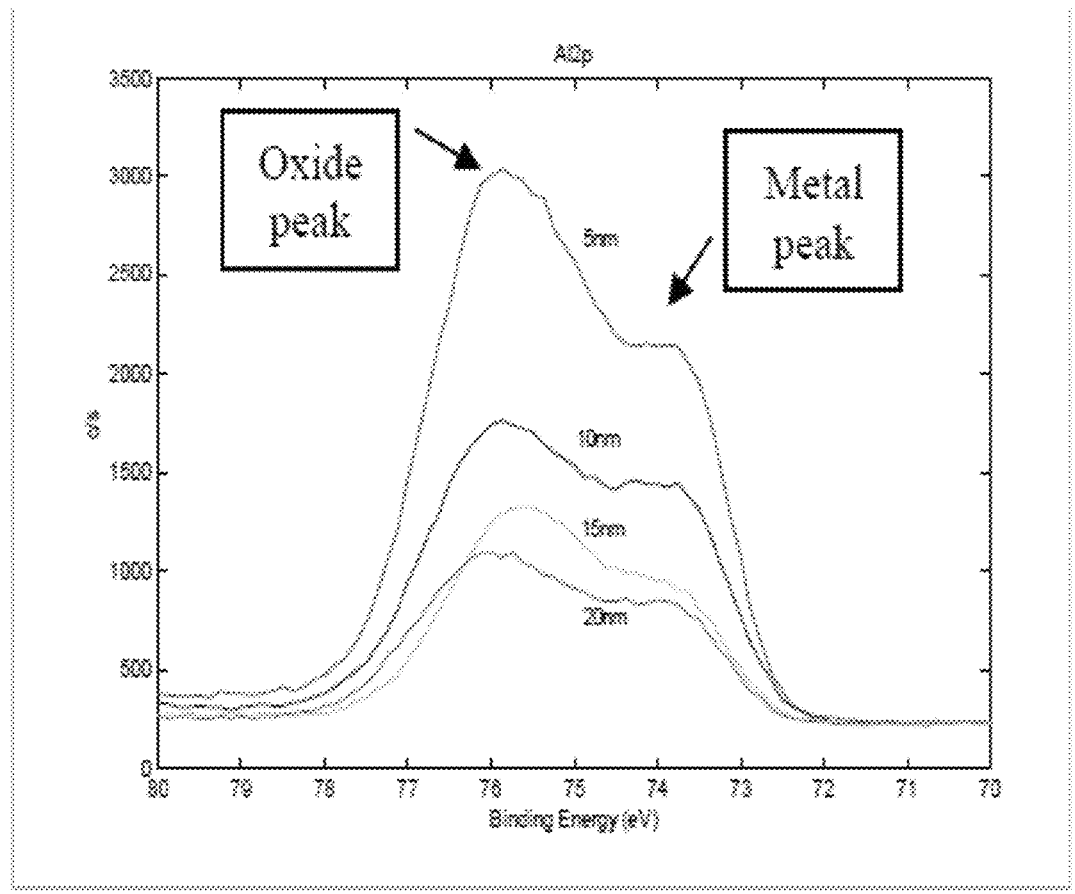
FIG. 3 shows XPS result from an Al film deposited by high vacuum ALD.

Trimethyaluminium (TMAl)-Al(CH3)$_3$ and mixed H/Ar plasma are used for this deposition. The films deposited on neatly insulating Si wafer with native oxide become more mirror/metallic-like and very conductive. X-ray photoelectron spectrometry (XPS) analysis indicate pure Al metal is deposited as shown in FIG. 3 for distinguishable Al2p metal peak and oxide peak in their binding energy measurement. The result surely proves that pure Al metal is deposited. On the contrary previous effort to deposit Al by PEALD never succeeded and some AlOx films were always obtained. The main difficulty lies in easy oxidation of Al metal on film surface and low H plasma efficiency in a conventional ALD reactor. The surface chemistry of Al metal deposition has been suggested that if the plasma can effectively break up metal-carbon bonds and reduce TMAl to Al.

EXAMPLE 2

We propose a process and surface chemistry that Mg(CpEt)$_2$ also has metal-carbon bonds and Mg sits only next to Al in the periodical table, it is thus possible that H plasma can reduce the Mg precursor to Mg metal as well similar to Al. To test this idea, Mg(CpEt)$_2$ and H plasma were used in the deposition. Films deposited on nearly insulating Si wafer with native oxide show mirror/metallic-like color and are very conductive.

Figure 4:
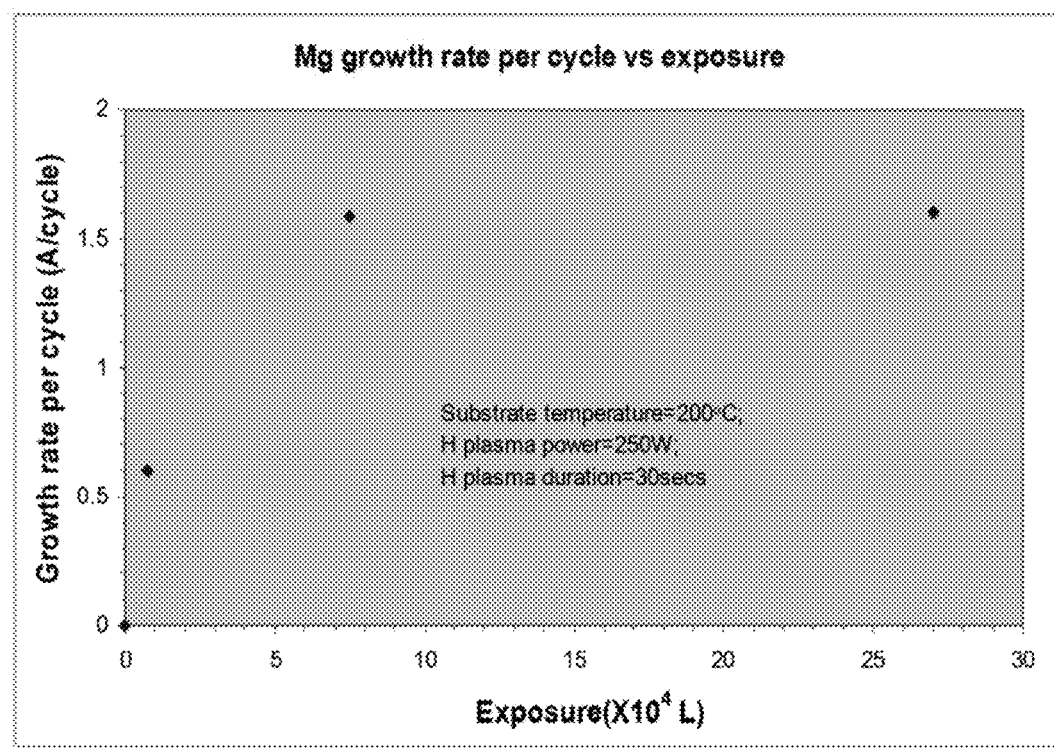
FIG. 4 is a graph showing growth rate per cycle (GRC) vs. $Mg(CpEt)_2$ exposure shows a clear saturation curve.
Figure 5:
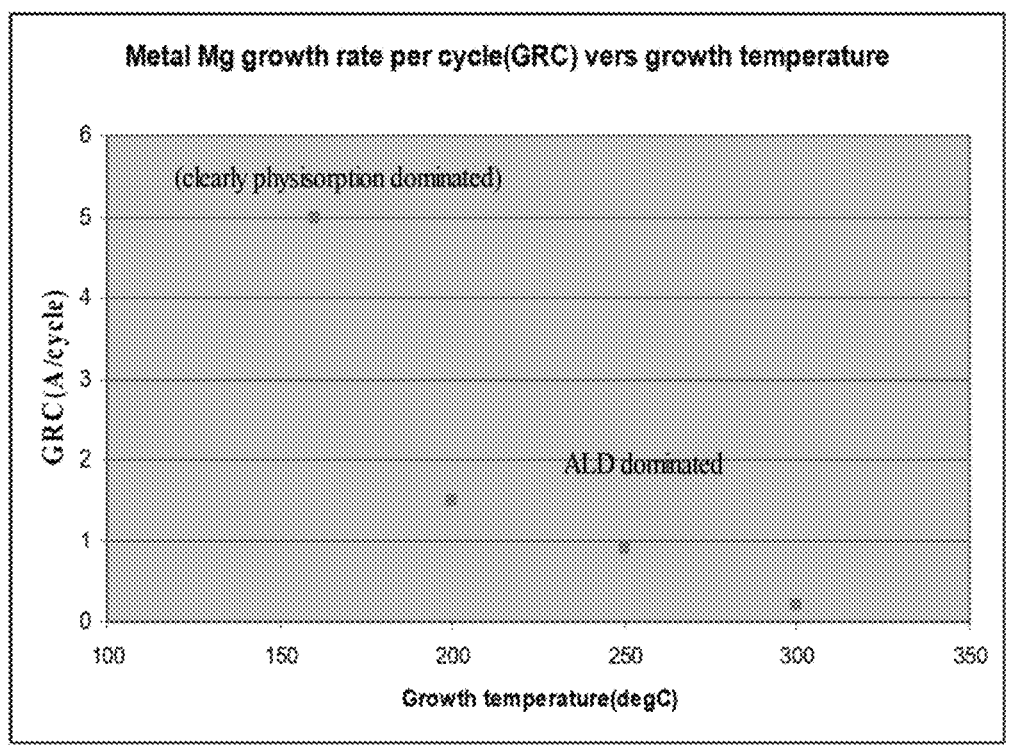
FIG. 5 shows a trend curve of Mg GRC vs. the growth temperature.

FIG. 4 shows the typical self limiting curve of Mg GRC vs. Mg(CpEt)$_2$ exposure with GRC of a 1.5-2.0 Å/cycle after saturation. FIG. 5 shows a trend curve of Mg GRC vs. the growth temperature. At ≤160° C., a much larger growth rate was obtained with a non-metallic and insulating film deposited indicating the deposition is most likely physi-sorption dominated thus poor quality Mg is obtained; at ≥200° C., Mg films show typical metallic color with GRC decreasing with increasing growth temperature. This may result from increased volatility and reduced sticking coefficient of Mg at elevated temperatures.

Figure 6A:
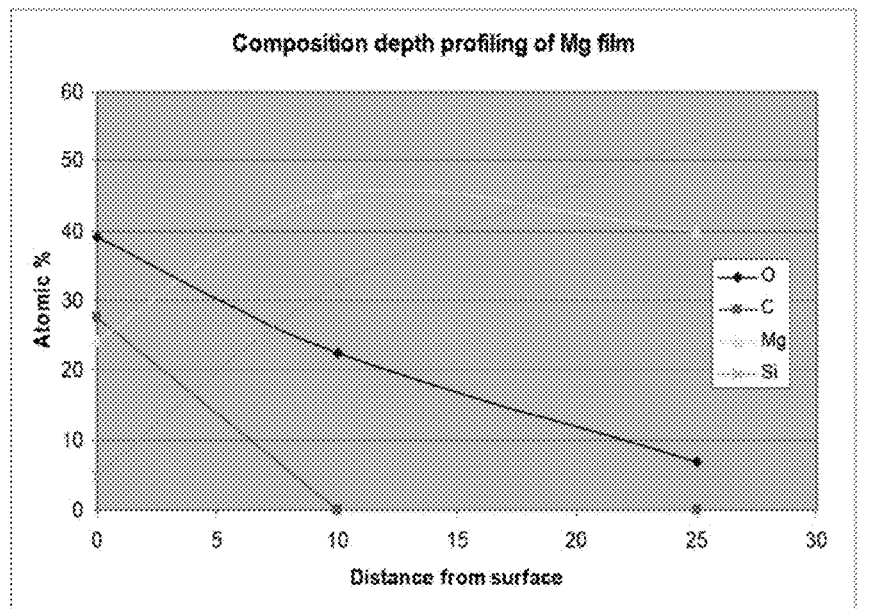
FIGS. 6A to 6C show XPS result from a relative thick Mg film ~70 nm.
Figure 6B:
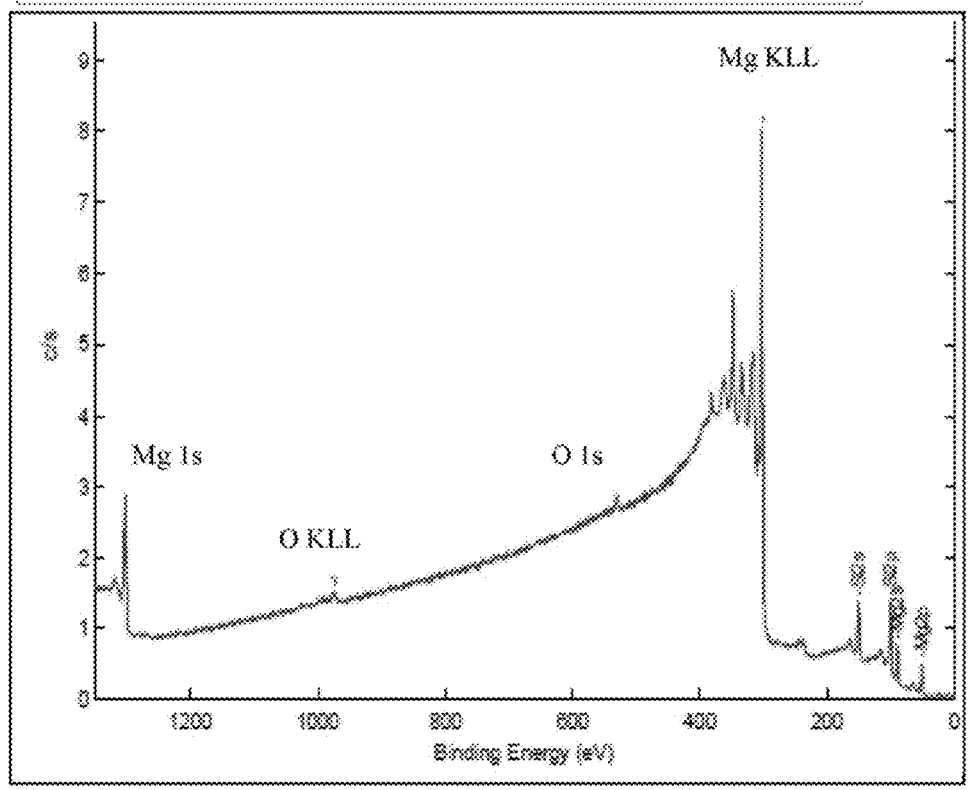
Figure 6C:
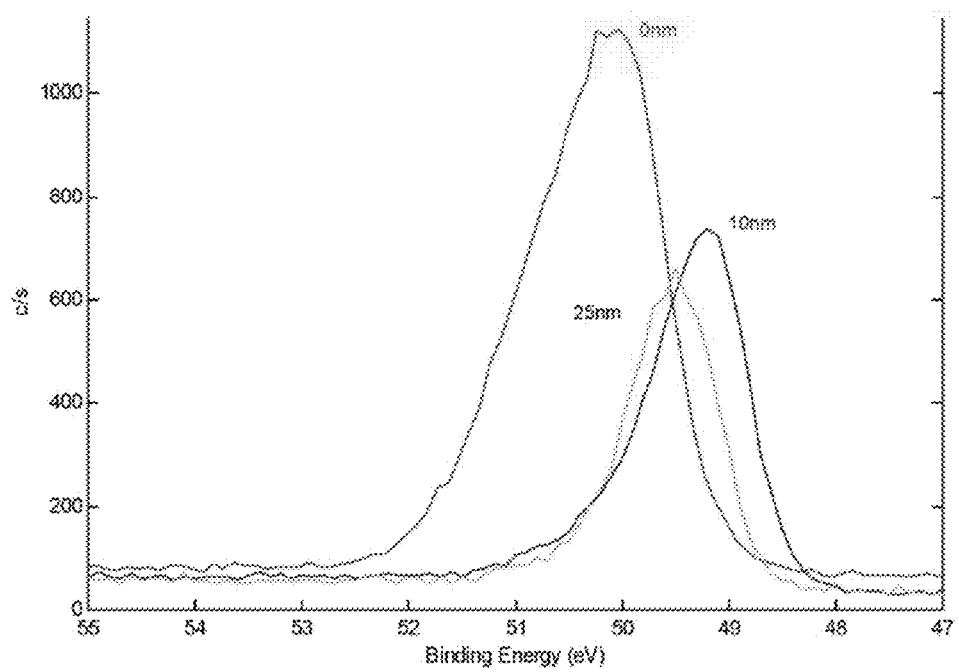

Most of as deposited Mg films showed strong O signals. To identify where exactly the O contaminant conies from, we deposited a relative thick Mg film ~70 nm, and a composition depth profiling by XPS was measured as shown in FIG. 6A. The O peak intensity keeps decreasing with increasing sputtered thickness indicating O is most likely from surface contaminant. C contamination in the film is negligible. The fact that Si content keeps increasing may result from Si substrate used and island formation of Mg. FIG. 6B shows a general survey scan after the Mg film surface is thoroughly cleaned by sputtering. Again the film is dominated by Mg peaks. O and other signals are significantly weaker. FIG. 6C shows fine scans of binding energy (Eb) around the Mg2p peak at different depth compared to the Mg film surface. The surface Mg2p Eb=50.2 eV is very close to that of an oxide Mg while at 10 to 25 nm depth, Mg2p Eb is very close to 49.5 eV from a pure Mg metal. See, e.g., J. S. Corneille, et al., Surface Science, 306 (1994) 269-278; S. Rajput, et al., Bull. Mater. Sci., Vol. 29, No. 3, June 2006, pp. 207-211. Indian Academy of Sciences; http:/srdata.nist.Gov/xps/. This confirms that pure Mg has been deposited.

Figure 8:
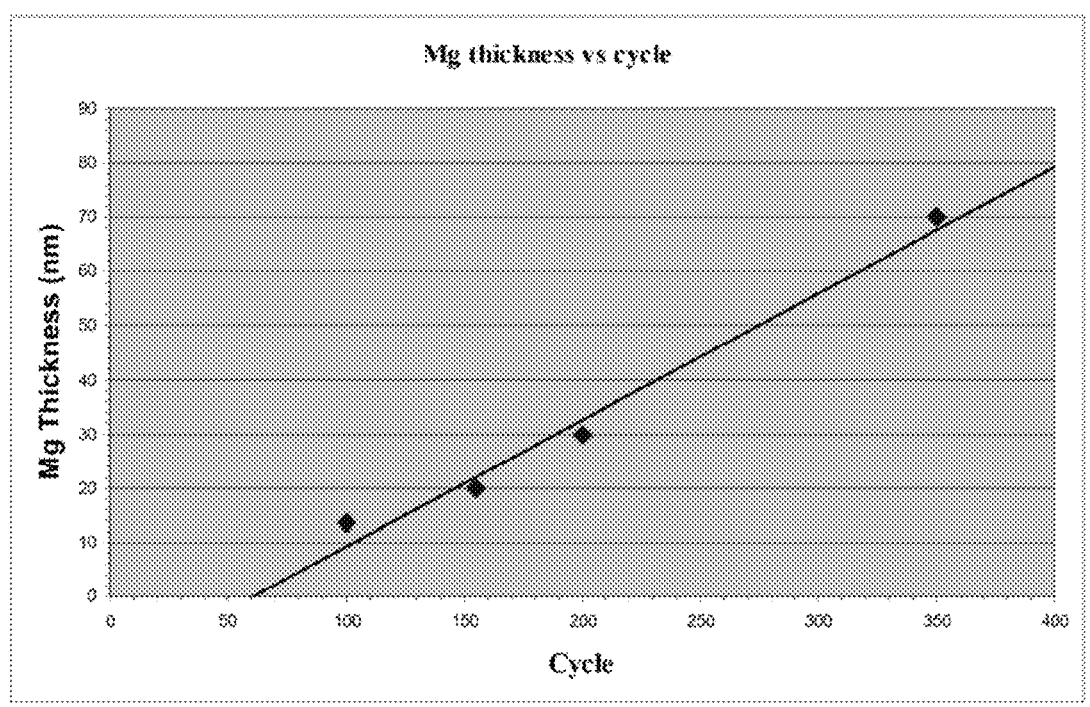
FIG. 8 is a graph showing the measured Mg thickness vs. the cycle number at a deposition temperature of 200° C.

FIG. 7A shows AFM surface morphology of a ~70 nm thick Mg film with RMS roughness =13 nm. Typical island morphology with very large surface roughness indicates a rough surface and severe discontinuity. This is confirmed by measured Mg thickness vs. the cycle number at a deposition temperature of 200° C. as shown in FIG. 8. The fact that the line does not intersect at zero suggests an incubation/nucleation period when Mg shows no physical thickness. This island morphology has been observed on silicon wafers, either with native $SiO_2$ or HF etching cleaned surface, glass slides, and c-sapphire wafers. Island formation of metals deposited by ALD is very common such as Cu, Pt, etc. See, e.g., Z. W. Li, et al, J. Electrochemical Society, 153(11) C787-C794 (2006), The main reason is low surface energy of the metals and their low adhesion to many material surfaces. The adhesion can be improved by using a variety of metallic glue materials as proved by R. Gordon's group. See, e.g., B. Han, et al., Angew. Chem. Int. Ed., 2010, 49, 148-152. Mg happens to have very low surface energy. Nb however is listed as a good glue material.

Measured resistivity of as deposited films by a standard 4 probe station turns out to be sensitive to substrate material used. We got $10^{-3}$ to $10^{-6}$ Ωcm on Si either with native $SiO_2$ or HF etched surface. Si wafers used are high resistivity type in the range of 100 Ωcm. However as deposited films on c-sapphire wafers are always insulating. We believe this result is related to island formation of Mg, especially when films are thin, islands are mostly isolated, no conductivity path is formed and thus no percolation happens. This phenomenon has been reported for Cu by ALD. No conductivity is measured even when the film is relatively thicker due to island formation.

FIG. 7B shows a reflection high energy electron diffraction (RHEED) image from an as deposited Mg film surface indicating Mg film is mainly polycrystalline with some texture. However, since Mg is very reactive to air, it is also possible that the RHEED pattern comes from some Mg oxides.

We demonstrated pure Mg can be deposited by H plasma ALD in a self limiting behavior. This result has been confirmed by XPS and atomic force microscopy (AFM) measurements as described below. This is the first time pure Mg metal is deposited by ALD. It further proves that high vacuum ALD and H reduction method is certain a way to deposit very reactive metals.

This invention provides a method of forming a thin film of elemental metal magnesium Mg in a high vacuum plasma enhanced atomic layer deposition (PEALD) system configured for realization of this method.

What is claimed is:

1. A method of forming a thin film of elemental metal magnesium (Mg) in a high vacuum plasma enhanced atomic layer deposition (PEALD) system, comprising:
   (i) sequentially pulsing vapor of a magnesium (Mg) containing organometallic precursor, and a hydrogen plasma as a reducing agent into a high vacuum reaction chamber containing a substrate surface;
   (ii) applying pulsed or continuous flow of an inert purge gas between each said pulsing step, thereby forming a single atomic layer of pure magnesium (Mg) metal; and
   (iii) repeating steps (i) and (ii) for a next atomic layer on top of the atomic layer in step (ii), thereby accumulating many atomic layers to form a thin film of pure magnesium (Mg);
   wherein said substrate surface is preheated to between 200-300° C.; and
   wherein a vacuum level of said high vacuum PEALD system is $4\times10^{-7}$ Torr or lower.

2. The method according to claim 1, wherein said magnesium (Mg) containing organometallic precursor is bis (ethylcyclopentadienyl) magnesium.

* * * * *